(12) United States Patent
Senda

(10) Patent No.: US 8,878,583 B2
(45) Date of Patent: Nov. 4, 2014

(54) PWM DUTY CYCLE CONVERTER

(71) Applicant: DENSO CORPORATION, Kariya (JP)

(72) Inventor: Yasutaka Senda, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 13/743,515

(22) Filed: Jan. 17, 2013

(65) Prior Publication Data

US 2013/0234769 A1    Sep. 12, 2013

(30) Foreign Application Priority Data

Mar. 9, 2012  (JP) ................................. 2012-53152
Sep. 25, 2012  (JP) ................................ 2012-210795

(51) Int. Cl.
*H03K 3/017*  (2006.01)
*H03K 5/04*  (2006.01)
*H03K 7/08*  (2006.01)

(52) U.S. Cl.
CPC ..................................... *H03K 3/017* (2013.01)
USPC ......................................... 327/175; 327/131

(58) Field of Classification Search
USPC ................................................. 327/131, 175
See application file for complete search history.

(56) References Cited

U.S. PATENT DOCUMENTS 3,855,520 A *  12/1974  Stich ............................. 323/283
5,896,053 A *   4/1999  Prentice ........................ 327/255
7,012,412 B2 *  3/2006  Kanamori et al. ............ 323/283
7,831,851 B2 * 11/2010  Yoshii ........................... 713/324
7,953,145 B2 *  5/2011  Matsushima ................. 375/238
8,134,348 B2 *  3/2012  Yamada ........................ 323/222
2004/0150379 A1 *  8/2004  Kanamori et al. ............ 323/282
2007/0109825 A1 *  5/2007  Qiu et al. ......................... 363/41
2007/0114986 A1 *  5/2007  Yoshii ........................... 323/288

FOREIGN PATENT DOCUMENTS

| JP | 10-337036 A   | 12/1998 |
| JP | 2003-304879 A | 10/2003 |
| JP | 2007-110835 A | 4/2007  |
| JP | 2011-172336 A | 9/2011  |

OTHER PUBLICATIONS

Office action mailed May 13, 2014 in the corresponding JP application No. 2012-210795 (with English translation).

* cited by examiner

*Primary Examiner* — Brandon S Cole
(74) *Attorney, Agent, or Firm* — Posz Law Group, PLC

(57) ABSTRACT

A PWM duty cycle converter includes a PWM signal generator, a timing signal generator, a limit signal generator, and a duty cycle limiter. The PWM signal generator generates a first PWM signal by comparing a triangular carrier wave with a duty command from a signal source. The timing signal generator generates a timing signal synchronously with at least one of a maximum value and a minimum value of the amplitude of the carrier wave. The limit signal generator generates a limit signal in response to the timing signal. The limit signal sets at least one of an upper limit and a lower limit on a duty cycle of the first PWM signal. The duty cycle limiter combines the first PWM signal and the limit signal to output a second PWM signal having a limited duty cycle.

8 Claims, 11 Drawing Sheets

US 8,878,583 B2

PWM DUTY CYCLE CONVERTER

CROSS REFERENCE TO RELATED APPLICATION

This application is based on Japanese Patent Application No 2012-53152 filed on Mar. 9, 2012 and No. 2012-210795 filed on Sep. 25, 2012, the contents of which are incorporated herein by reference.

FIELD

The present disclosure relates to a pulse width modulation (PWM) duty cycle converter for setting a limit on a duty cycle of a PWM signal that is generated by comparing a duty command from a signal source with a triangular carrier wave.

BACKGROUND

In JP-A-2011-172336, temperatures of semiconductor devices are represented by duty cycles of PWM signals, and the PWM signals are serially outputted from a single output terminal. In such a structure, a receiver for receiving the PWM signals needs to distinguish the PWM signals from each other. Therefore, it is necessary to form an edge in the PWM signals by limiting a duty cycle of each PWM signal. For example, as shown in FIGS. 12A and 12B, when a duty command (i.e., analog signal input) indicates a duty cycle of 100%, a 100% duty cycle PWM signal is outputted accordingly. In this case, the boundary between the PWM signals becomes indefinite. In contrast, as shown in FIG. 12C, when the upper limit is set on the duty cycle of the PWM signal, the boundary between the PWM signals becomes definite.

To obtain the temperature over a wide range, accuracy with which the duty cycle is limited is important. In JP-A-2011-172336, the duty cycle is limited by using an analog circuit such as a comparator. Since a threshold voltage of the comparator and an amplitude of a carrier wave may vary, the accuracy may be low. For example, assuming that the accuracy is 10%, when both an upper limit and a lower limit are set on the duty cycle, variation of 10% may occur in each of the upper limit and the lower limit. Therefore, it is necessary to limit the maximum duty cycle to 80%.

In US 2004/0150379 corresponding to JP-A-2004-229451, an upper limit is set on a duty cycle of a PWM signal used for a switching regulator. The duty cycle is limited by using a current mirror circuit. Thus, even when a manufacturing variation or an ambient temperature change occurs, the variation or change is cancelled so that the duty cycle can be limited with high accuracy.

However, when the duty cycle is limited close to 0% or 100% by using a current mirror circuit, the current mirror circuit needs to have a small or large mirror ratio. As a result, the accuracy with which the duty cycle is limited may become low.

SUMMARY

In view of the above, it is an object of the present disclosure to provide a PWM duty cycle converter for accurately setting a limit on a duty cycle of a PWM signal.

According to an aspect of the present disclosure, a PWM duty cycle converter includes a PWM signal generator, a timing signal generator, a limit signal generator, and a duty cycle limiter. The PWM signal generator generates a first PWM signal by comparing a triangular carrier wave with a duty command from a signal source. The timing signal generator generates a timing signal synchronously with at least one of a maximum value and a minimum value of the amplitude of the carrier wave. The limit signal generator generates a limit signal in response to the timing signal. The limit signal sets at least one of an upper limit and a lower limit on a duty cycle of the first PWM signal. The duty cycle limiter combines the first PWM signal and the limit signal to output a second PWM signal having a limited duty cycle.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

First Embodiment

Figure 1:
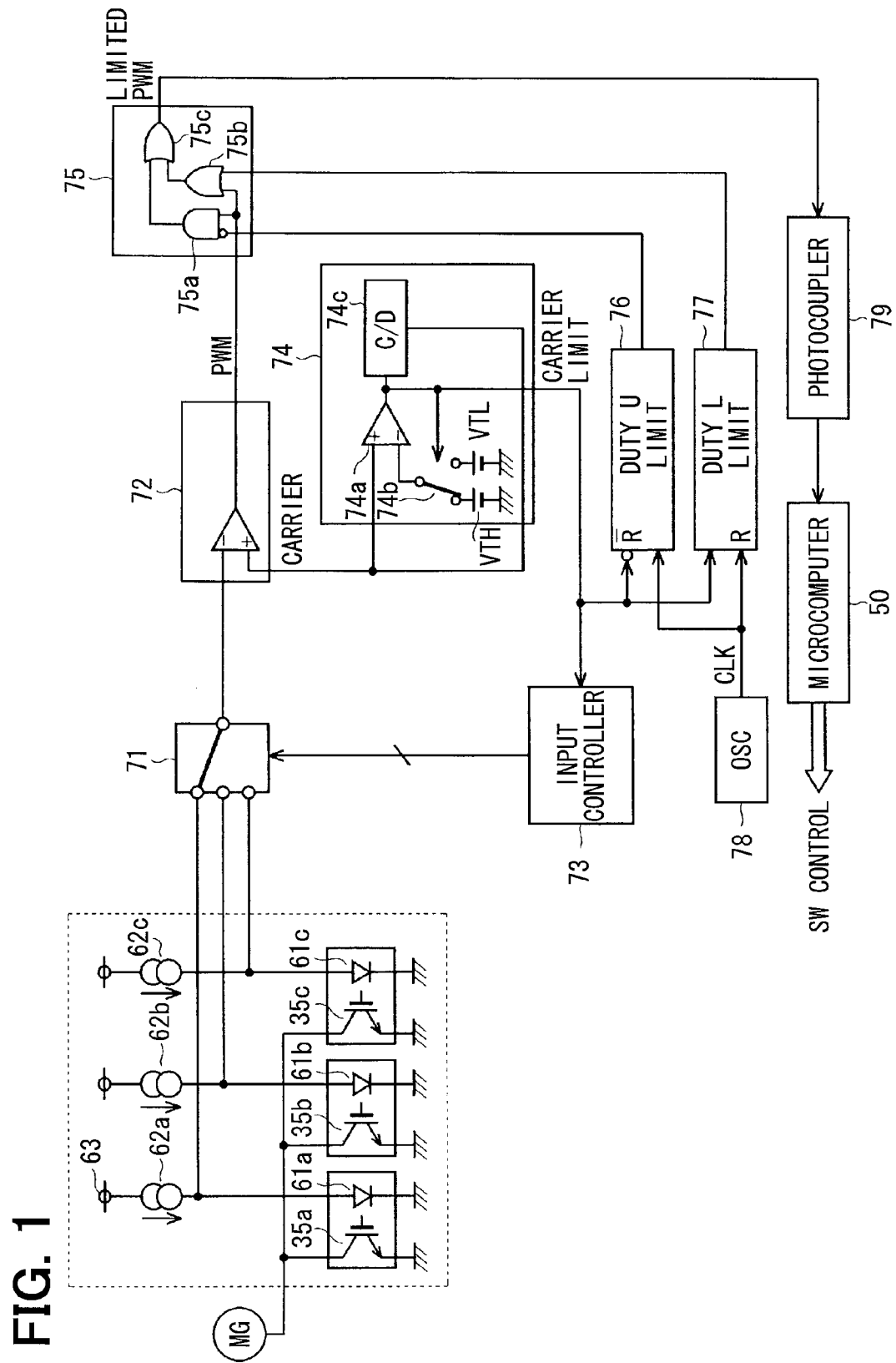
FIG. 1 illustrates a functional block diagram of a PWM duty cycle converter according to a first embodiment of the present disclosure.
Figure 2:
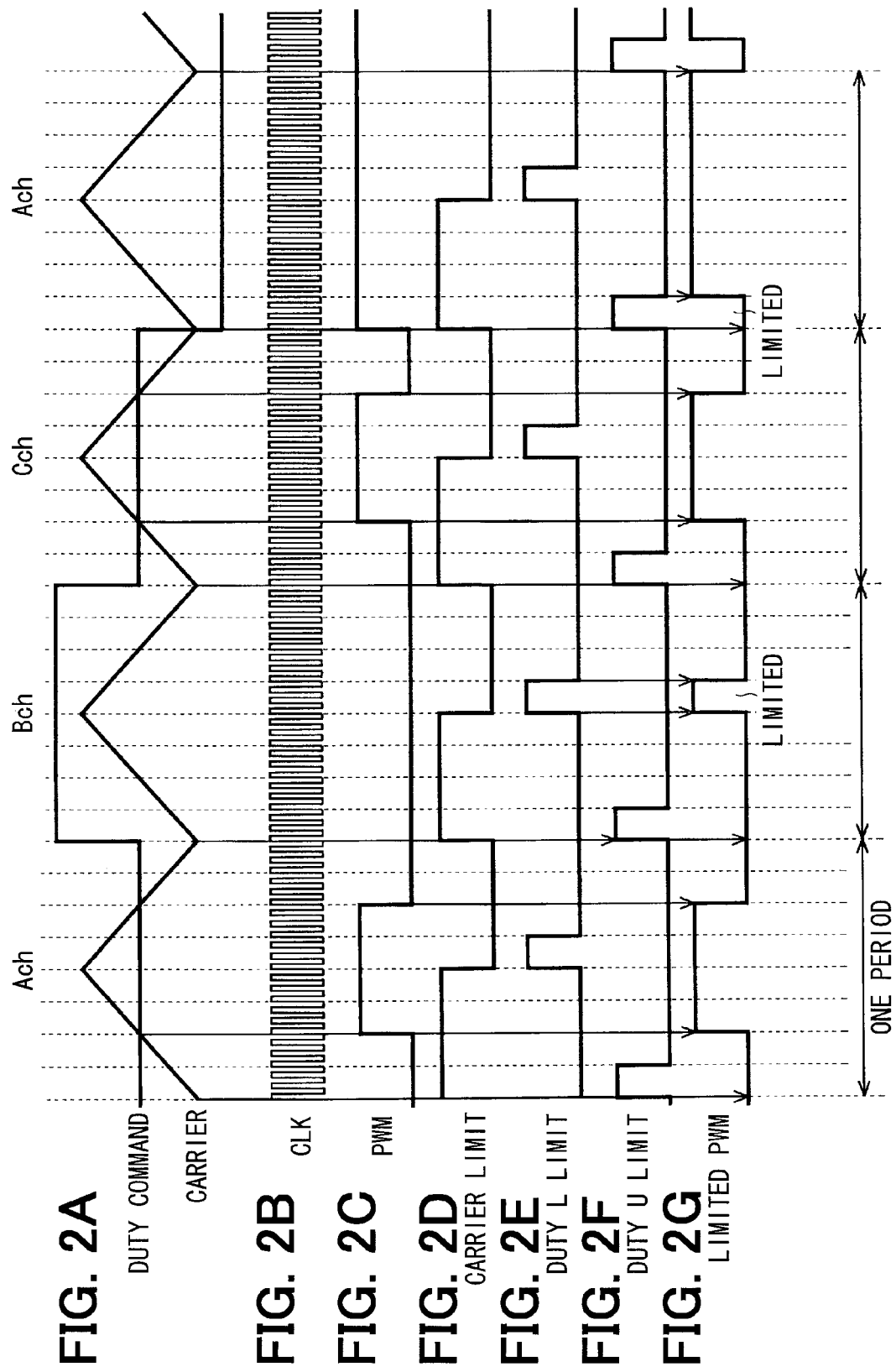
FIGS. 2A-2G illustrate a timing chart of the PWM duty cycle converter according to the first embodiment.
Figure 3:
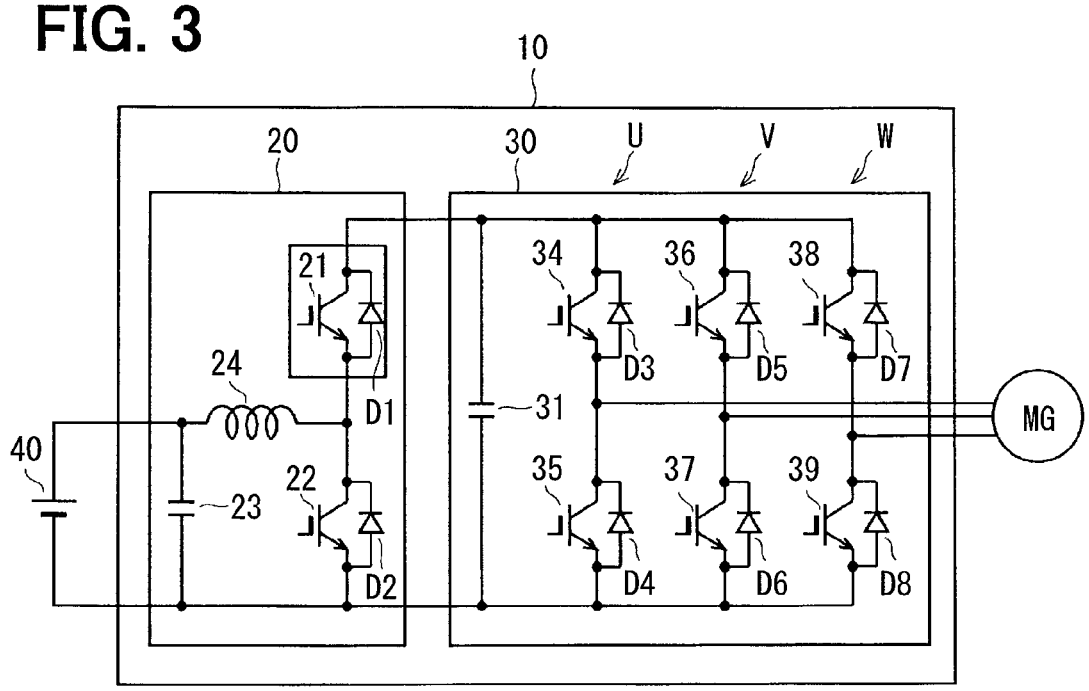
FIG. 3 illustrates a power converter.

A pulse width modulation (PWM) duty cycle converter according to a first embodiment of the present disclosure is described below with reference to FIG. 1, FIGS. 2A-2G, and FIG. 3. As shown in FIG. 3, a power conversion apparatus 10 includes a converter 20 and an inverter 30. The inverter 30 drives and controls a motor generator (MG). The power conversion apparatus 10 is controlled by a microcomputer 50 (refer to FIG. 1). A battery 40 is connected to the converter 20. The battery 40 supplies direct-current (DC) power to the converter 20 and stores DC power regenerated through the converter 20. The converter 20 steps up DC power supplied from the battery 40 and outputs the stepped-up power to the inverter 30. Further, the converter 20 steps down DC power outputted from the inverter 30 and outputs the stepped-down power to the battery 40.

A configuration of the converter 20 is described below. A first end of a capacitor 23 and a first end of a reactor 24 are connected to a positive terminal of the battery 40. A second end of the capacitor 23 and an emitter terminal of a switching device 22 are connected to a negative terminal of the battery 40. The switching device 21 is connected in series with a switching device 22. A second end of the reactor 24 is connected to the emitter terminal of the switching device 21 and a collector terminal of the switching device 22. For example, according to the first embodiment, each of the switching devices 21, 22 is an insulated gate bipolar transistor (IGBT).

A collector of the switching device 21 is connected to a first end of the inverter 30. An emitter of the switching device 22 is connected to a second end of the inverter 30. A freewheeling diode D1 is connected in anti-parallel with the switching device 21. That is, the collector of the switching device 21 is connected to a cathode of the freewheeling diode D1, and an emitter of the switching device 21 is connected to an anode of the freewheeling diode D1. Likewise, a freewheeling diode D2 is connected in anti-parallel with the switching device 22.

A DC bus line of the inverter 30 is connected to an input-output terminal of the converter 20. The inverter 30 converts the stepped-up DC voltage received from the converter 20 into a three-phase alternating-current (AC) voltage and outputs the three-phase AC voltage to the motor generator. When the motor generator operates as a power generator, the inverter 30 converts AC power outputted from the motor generator into DC power and outputs the DC power to the converter 20. A capacitor 31 is connected between the converter 20 and the inverter 30.

The inverter 30 includes six switching devices 34-39 that are connected to form a three-phase bridge circuit. Freewheeling diodes D3-D8 are connected in anti-parallel with the switching devices 34-39, respectively. An output terminal of each phase of the inverter 30 is connected to one end of a corresponding phase coil (not shown) of the motor generator.

The inverter 30 includes three legs. Specifically, the upper switching device 34 and the lower switching device 35 are connected in series to form a U-phase leg, the upper switching device 36 and the lower switching device 37 are connected in series to form a V-phase leg, and the upper switching device 38 and the lower switching device 39 are connected in series to form a W-phase leg. The microcomputer 50 controls the inverter 30 in such a manner that the upper and lower switching devices in each leg cannot be ON and OFF at the same time. For example, in the U-phase leg, when the switching device 34 is ON, the switching device 35 is OFF. Likewise, the microcomputer 50 controls the converter 20 in such a manner that the upper switching device 21 and the lower switching device 22 cannot be ON and OFF at the same time.

As described above, in the power conversion apparatus 10, the switching devices 21, 22 of the converter 20 and the switching devices 34-39 of the inverter 30 are controlled by the microcomputer 50 so that the converter 20 can step up DC power supplied from the battery 40 and so that the inverter 30 can convert the DC power into three-phase AC power. Thus, the motor generator is driven by the three-phase AC power. In contrast, when the motor generator operates as a power generator, the inverter 30 converts AC power outputted from the motor generator into DC power, and the converter 20 steps down the DC power so that the battery 40 can store the DC power.

A method of controlling the inverter 30 is described below with reference to FIG. 1. As an example of the switching devices 34-39 of the inverter 30, FIG. 1 illustrates the lower switching device 35 in the U-phase leg. It is noted that the other switching devices 34 and 36-39 are configured in the same manner as the switching device 35. The lower switching device 35 includes three switching elements 35a, 35b, and 35c. Each of the switching elements 35a, 35b, and 35c is connected between a ground potential and one end of a U-phase coil (not shown) of the motor generator. Thus, the same gate signal is applied to the switching elements 35a, 35b, and 35c so that the switching elements 35a, 35b, and 35c can be turned ON and OFF at the same time. The switching elements 35a, 35b, and 35c are provided with diodes 61a, 61b, and 61c (as signal sources), respectively. The switching elements 35a, 35b, and 35c are individually packaged with the respective diodes 61a, 61b, and 61c. The diodes 61a, 61b, and 61c serve as temperature sensors for detecting temperatures of the switching elements 35a, 35b, and 35c, respectively.

Cathodes of the diodes 61a, 61b, and 61c are connected to the ground potential. Anodes of the diodes 61a, 61b, and 61c are connected to a power supply 63 through constant current sources 62a, 62b, and 62c, respectively. The power supply 63 receives power from the battery 40 through the converter 20. As described later, the microcomputer 50 reads voltages of the anodes of the diodes 61a, 61b, and 61c. The anode voltages of the diodes 61a, 61b, and 61c are used as temperature detection signals indicative of the temperatures of the switching elements 35a, 35b, and 35c. The diodes 61a, 61b, and 61c are hereinafter referred to as the "channel Ach", "channel Bch", and "channel Cch", respectively.

A switcher (i.e., multiplexer) 71 has three input terminals. The anodes of the diodes 61a, 61b, and 61c are connected to the respective input terminals of the switcher 71. An output terminal of the switcher 71 is connected to an input terminal of a duty converter 72 (as a PWM signal generator). The switcher 71 selects one input terminal in accordance with a selection signal outputted from an input controller 73. Thus, the anode voltages (as analog input signals) of the channels Ach, Bch, and Cch are sequentially outputted as duty commands from the switcher 71 in the order determined by the input controller 73.

A triangular wave as a reference wave (i.e., carrier wave) is inputted to the duty converter 72 from a reference wave generator 74 (as a timing signal generator). As shown in FIG. 2A, the duty converter 72 compares the amplitude of the reference wave with each of the anode voltages of the channels Ach, Bch, and Cch as the duty commands, by using a comparator. Thus, the duty converter 72 generates and outputs a duty signal (i.e., PWM signal) to an output controller 75 (as a duty cycle limiter). As shown in FIG. 2C, a duty cycle of the PWM signal changes according to the channels Ach, Bch, and Cc in a period of the reference wave.

The reference wave generator 74 includes a comparator 74a, a multiplexer 74b, and a charge-discharge section 74c. The output terminal of the multiplexer 74b is connected to an inverting input terminal of the comparator 74a. The multiplexer 74b selects and outputs one of a high reference voltage VTH and a low reference voltage VTL in accordance with a control signal outputted from the comparator 74a. The high reference voltage VTH is almost equal to the maximum value of the amplitude of the reference wave. The low reference voltage VTL is almost equal to the minimum value of the amplitude of the reference wave.

Although not shown in the drawing, the charge-discharge section 74c repeatedly charges and discharges a capacitor by a constant current in accordance with the control signal outputted from the comparator 74a, thereby generating and outputting the triangular wave as the reference wave. The control signal is a square wave. The control signal is at a high level during an increase in the amplitude of the reference wave and at a low level during a decrease in the amplitude of the reference wave. The control signal is hereinafter sometimes referred to as the "reference wave (i.e., carrier) limit signal" (as a timing signal). As shown in FIG. 2D, the reference wave limit signal becomes a square wave having a duty cycle of 50% and having the same period as the reference wave.

The reference wave limit signal is inputted to each of the input controller 73, a duty upper limit signal generator 76 (as a limit signal generator and a counter), and a duty lower limit signal generator 77 (as a limit signal generator and a counter). The input controller 73 is a two-bit counter. Each time the rising edge of the reference wave limit signal is inputted to the input controller 73, the input controller 73 increments by one. The input controller 73 counts in the sequence 0, 1, 2, and then repeats the sequence. The input controller 73 outputs the selection signal to the switcher 71 in accordance with the count value (i.e., 0, 1, or 2) of the input controller 73, and the switcher 71 sequentially outputs the anode voltages of the channels Ach, Bch, and Cch as the duty commands in accordance with the selection signal from the input controller 73.

Each of the upper limit signal generator 76 and the lower limit signal generator 77 is a counter. A clock signal CLK is inputted from an oscillator circuit 78 (as a limit signal generator) to each of the upper limit signal generator 76 and the lower limit signal generator 77. As shown in FIG. 2B, a frequency of the clock signal CLK is sufficiently higher than a frequency of the reference signal. The upper limit signal generator 76 remains reset during a high level of the reference wave limit signal and performs a counting operation based on the clock signal CLK during a low level of the reference wave limit signal. In contrast, the lower limit signal generator 77 remains reset during the low level of the reference wave limit signal and performs a counting operation based on the clock signal CLK during the high level of the reference wave limit signal. That is, the reference wave limit signal serves as a reset signal for resetting the upper limit signal generator 76 and the lower limit signal generator 77.

The upper limit signal generator 76 includes a comparator and a register for storing a predetermined threshold value. When the reset signal becomes inactive, the upper limit signal generator 76 starts the counting operation so that a duty upper limit signal outputted from the upper limit signal generator 76 can change to a high (i.e., active) level. Then, when a count value of the upper limit signal generator 76 reaches the threshold value stored in the register, the duty upper limit signal outputted from the upper limit signal generator 76 changes to a low (i.e., inactive) level.

Likewise, the lower limit signal generator 77 includes a comparator and a register for storing a predetermined threshold value. When the reset signal becomes inactive, the lower limit signal generator 77 starts the counting operation so that a duty lower limit signal outputted from the lower limit signal generator 77 can change to a high (i.e., active) level. Then, when a count value of the lower limit signal generator 77 reaches the threshold value stored in the register, the duty lower limit signal outputted from the lower limit signal generator 77 changes to a low (i.e., inactive) level.

Each of the duty upper limit signal and the duty lower limit signal is inputted to the output controller 75. The output controller 75 includes an AND gate 75$a$ (as a second logic gate), an OR gate 75$b$ (as a first logic gate), and an OR gate 75$c$ (as a third logic gate). The PWM signal from the duty converter 72 is inputted to a first input terminal of each of the AND gate 75$a$ and the OR gate 75$b$. The duty upper limit signal is inputted to a second input terminal of the AND gate 75$a$. It is noted that the second input terminal of the AND gate 75$a$ is provided with a NOT gate (i.e., inverter). The duty lower limit signal is inputted to a second input terminal of the OR gate 75$b$. An output terminal of the AND gate 75$a$ is connected to a first input terminal of the OR gate 75$c$. An output terminal of the OR gate 75$b$ is connected to a second input terminal of the OR gate 75$c$. The OR gate 75$c$ outputs a limited PWM signal having a limited duty cycle. The limited PWM signal is inputted through a photocoupler 79 to an input terminal of the microcomputer 50.

An operation of the first embodiment is described below with reference to FIGS. 2A-2G. As shown in FIG. 2D, the rising edge of the reference wave limit signal appears synchronously with the minimum value of the amplitude of the reference wave, and the falling edge of the reference wave limit signal appears synchronously with the maximum value of the amplitude of the reference wave. The upper limit signal generator 76 starts the counting operation synchronously with the rising edge of the reference wave limit signal. The lower limit signal generator 77 starts the counting operation synchronously with the falling edge of the reference wave limit signal. Therefore, as shown in FIG. 2F, the duty upper limit signal becomes high level when the amplitude of the reference wave reaches the minimum value. Likewise, as shown in FIG. 2E, the duty lower limit signal becomes high level when the amplitude of the reference wave reaches the maximum value.

The threshold value stored in the register of the lower limit signal generator 77 is set so that the duty lower limit signal can be a pulse signal having a duty cycle of 12.5%. A result of a logical OR operation between the PWM signal and the duty lower limit signal is outputted from the OR gates 75$b$ and 75$c$. Therefore, as shown in FIGS. 2C and 2G, even when the PWM signal of the channel Bch has a duty cycle of 0%, the limited PWM signal outputted from the output controller 75 has the lower limit duty cycle of 12.5%.

The threshold value stored in the register of the upper limit signal generator 76 is set so that the duty upper limit signal can be a pulse signal having a duty cycle of 12.5%. A result of a logical AND operation between the PWM signal and an inversion signal of the duty upper limit signal is outputted from the AND gate 75$a$ and the OR gate 75$c$. Therefore, as shown in FIGS. 2C and 2G, even when the PWM signal of the channel Ach has a duty cycle of 100%, the limited PWM signal outputted from the output controller 75 has the upper limit duty cycle of 88.5% (=100%−12.5%).

Here, accuracy is discussed by assuming that the period of the reference wave is 5 ms (i.e., the frequency of the reference wave is 200 Hz), the period of the clock signal CLK is 2.5 μs (i.e., the frequency of the clock signal CLK is 400 kHz), the oscillator circuit 78 has accuracy of ±30%, and the duty upper and lower limit signals are outputted when ten clock signals CLK are counted. Further, since the reference wave and the clock signal CLK are asynchronous to each other, an error of one clock signal CLK is taken into account. In this case, a variation in the accuracy can be calculated as follows: 2.5 μs×10×1.3−2.5 μs×9×0.7=16.75 μs=0.335% duty cycle. Therefore, it is possible that the upper limit and the lower limit of the duty cycle of the PWM signal are set close to 0% and 100%, respectively.

As described above, according to the first embodiment, the duty converter 72 generates one PWM signal (i.e., a continuous PWM signal) by serially arranging the duty commands of the channels Ach, Bch, and Cch indicative of the temperatures detected by the diodes 61$a$, 61$b$, and 61$c$ and by comparing the serially-arranged duty commands with the triangular reference wave. The reference wave generator 74 generates the reference wave limit signal that changes synchronously with the minimum and maximum values of the amplitude of the reference wave. The upper limit signal generator 76 generates the duty upper limit signal in response to the edge of the reference wave limit signal. The lower limit signal generator 77 generates the duty lower limit signal in response to the edge of the reference wave limit signal. The output controller 75 combines the PWM signal and the duty upper limit signal and/or the duty lower limit signal to output the limited PWM signal having the limited duty cycle.

Each of the duty upper limit signal and the duty lower limit signal is outputted synchronously with the reference wave. The upper limit of the duty cycle is determined by the threshold value stored in the register of the upper limit signal generator 76. The lower limit of the duty cycle is determined by the threshold value stored in the register of the lower limit signal generator 77. Therefore, the upper and lower limits of the duty cycle of the PWM signal can be accurately controlled with a simple configuration. Each of the duty upper limit signal and the duty lower limit signal is outputted as a high-level pulse. The OR gate 75b outputs the result of the logical OR operation between the PWM signal and the duty lower limit signal. The AND gate 75a outputs the result of the logical AND operation between the PWM signal and the inversion signal of the duty upper limit signal. The OR gate 75c outputs a result of a logical OR operation between an output signal of the OR gate 75b and an output signal of the AND gate 75a. Thus, the lower limit of the duty cycle of the PWM signal can be determined by a pulse width of the high-level pulse of the duty lower limit signal, and the upper limit of the duty cycle of the PWM signal can be determined by subtracting a time width of the duty upper limit signal from a pulse width of a 100% duty cycle pulse.

The reference wave generator 74 outputs the reference wave limit signal when the amplitude of the reference wave reaches the minimum value or the maximum value. The reference wave limit signal is a square wave having the same period as the reference wave and having a duty cycle of 50%. Therefore, an edge of the reference wave limit signal indicates the minimum value or the maximum value of the amplitude of the reference wave. Thus, both the duty lower limit signal and the duty upper limit signal can be outputted by using one signal (i.e., the reference wave limit signal). Further, the control signal for causing the charge-discharge section 74c to repeatedly charge and discharge the capacitor is used as the reference wave limit signal. Therefore, an additional structure for generating the reference wave limit signal is unnecessary.

The frequency of the clock signal CLK outputted from the oscillator circuit 78 is higher than the frequency of the reference wave. When the rising edge of the reference wave limit signal appears, the upper limit signal generator 76 starts the counting operation based on the clock signal CLK and changes the duty upper limit signal to a high (i.e., active) level. Then, after the counting operation is continued for a time period corresponding to the threshold value stored in the register of the upper limit signal generator 76, the upper limit signal generator 76 changes the duty upper limit signal to a low (i.e., inactive) level. Thus, the upper limit of the duty cycle of the PWM signal can be easily adjusted by adjusting the threshold value stored in the register of the upper limit signal generator 76. When the falling edge of the reference wave limit signal appears, the lower limit signal generator 77 starts the counting operation based on the clock signal CLK and changes the duty lower limit signal to a high (i.e., active) level. Then, after the counting operation is continued for a time period corresponding to the threshold value stored in the register of the lower limit signal generator 77, the lower limit signal generator 77 changes the duty lower limit signal to a low (i.e., inactive) level. Thus, the lower limit of the duty cycle of the PWM signal can be easily adjusted by adjusting the threshold value stored in the register of the lower limit signal generator 77.

Second Embodiment

Figure 4:
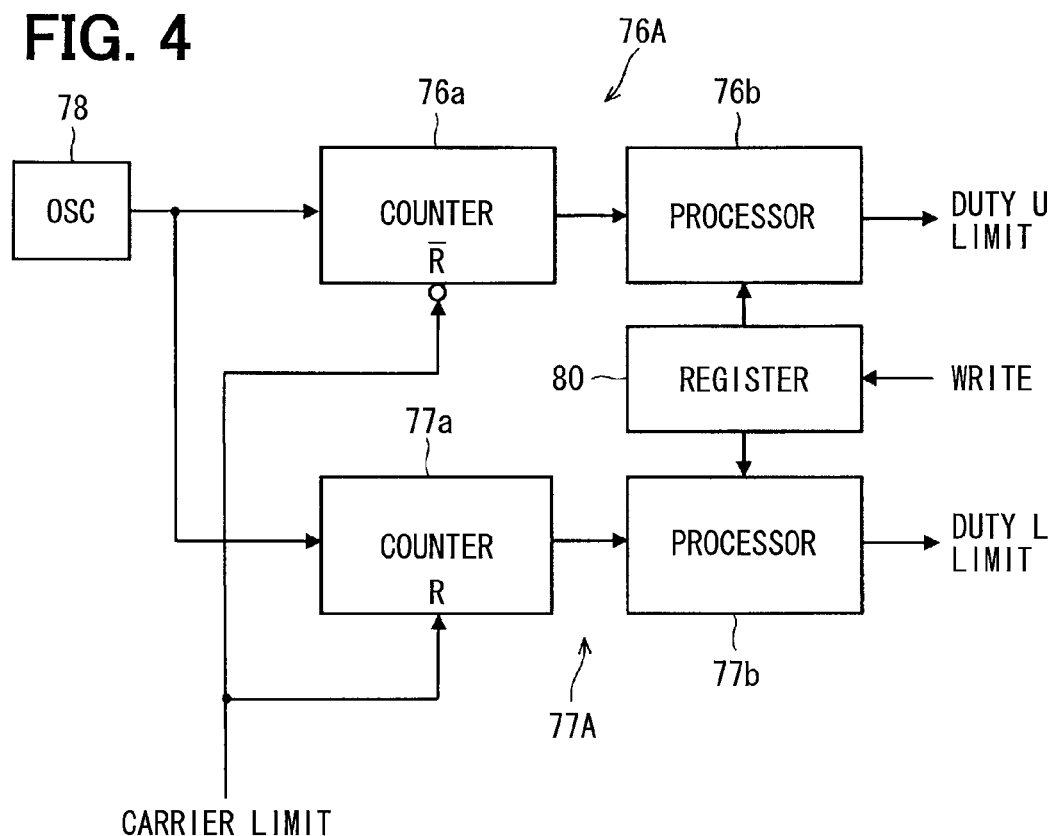
FIG. 4 illustrates a functional block diagram of a part of a PWM duty cycle converter according to a second embodiment of the present disclosure.
Figure 5:
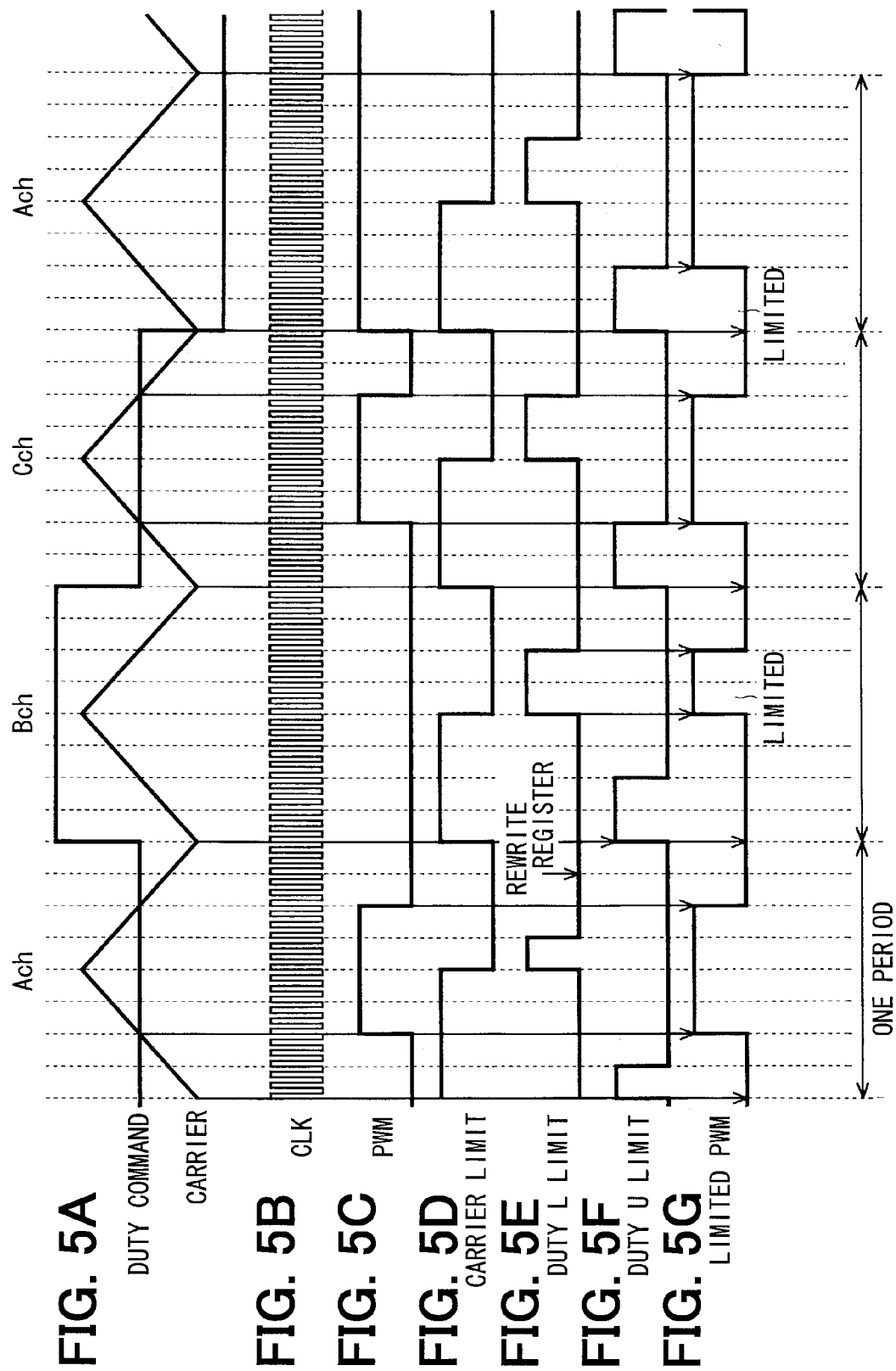
FIGS. 5A-5G illustrate a timing chart of the PWM duty cycle converter according to the second embodiment.

A PWM duty cycle converter according to a second embodiment of the present disclosure is described below with reference to FIG. 4 and FIGS. 5A-5G. A difference between the first embodiment and the second embodiment is as follows. FIG. 4 illustrates a part corresponding to a part of FIG. 1. According to the second embodiment, a duty limit register 80 is added in order to change a time width of a duty upper limit signal outputted from an upper limit signal generator 76A and in order to change a time width of a duty lower limit signal outputted from a lower limit signal generator 77A.

The upper limit signal generator 76A includes a counter 76a and a processor 76b. The lower limit signal generator 77A includes a counter 77a and a processor 77b. The microcomputer 50 writes a threshold value in the duty limit register 80. The threshold value written in the duty limit register 80 is inputted to the processors 76b and 77b. For example, each of the processors 76b and 77b is a comparator.

The processor 76b compares a count value of the counter 76a with the threshold value of the duty limit register 80. The duty upper limit signal outputted from the upper limit signal generator 76A is kept at a high level during a time period when the count value of the counter 76a is equal to or less than the threshold value. The duty upper limit signal changes to a low level, when the count value of the counter 76a exceeds the threshold value.

The processor 77b compares a count value of the counter 77a with the threshold value of the duty limit register 80. The duty lower limit signal outputted from the lower limit signal generator 77A is kept at a high level during a time period when the count value of the counter 77a is equal to or less than the threshold value. The duty lower limit signal changes to a low level, when the count value of the counter 77a exceeds the threshold value.

An operation of the second embodiment is described below with reference to FIGS. 5A-5G. For example, assuming that the microcomputer 50 rewrites the threshold value in the duty limit register 80 from a value equivalent to a duty cycle of 12.5% to a value equivalent to a duty cycle of 25% at a rewriting timing indicated by an arrow in FIG. 5E. After the rewriting timing, the duty lower limit signal has a duty cycle of 25%, and the duty upper limit signal has a duty cycle of 75%.

As described above, according to the second embodiment, the duty limit register 80 is added in order to change the time width of the duty upper limit signal and the time width of the duty lower limit signal. In such an approach, the upper and lower limits of the duty cycle of the PWM signal can be dynamically adjusted depending on the intended use.

Third Embodiment

Figure 6:
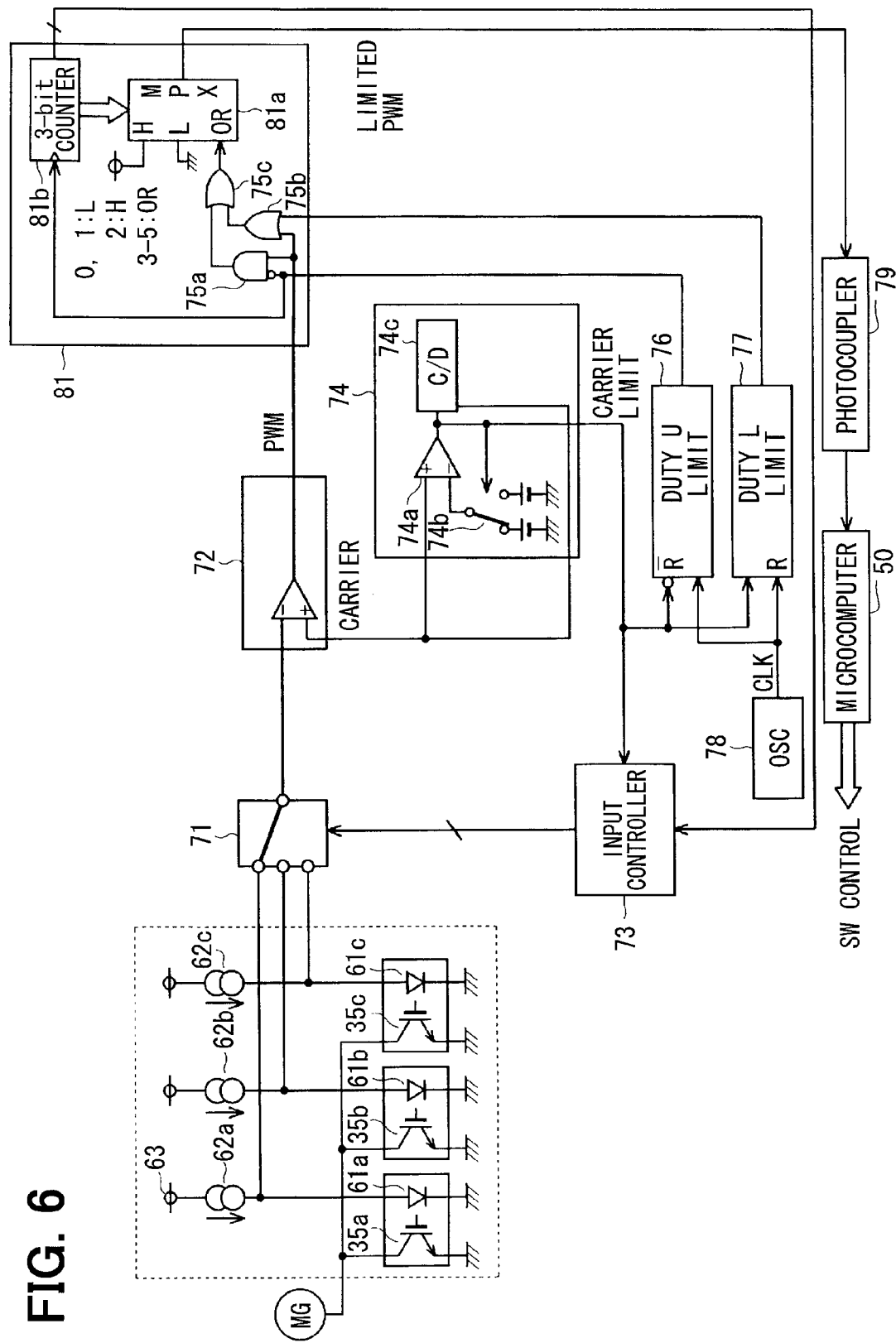
FIG. 6 illustrates a functional block diagram of a PWM duty cycle converter according to a third embodiment of the present disclosure.

A PWM duty cycle converter according to a third embodiment of the present disclosure is described below with reference to FIG. 6 and FIG. 7. A difference between the first embodiment and the third embodiment is as follows. According to the third embodiment, an output controller 81 instead of the output controller 75 has a function of adding a header, indicating the period of the reference wave, to the limited PWM signal. Like the output controller 75 of the first embodiment, the output controller 81 includes the AND gate 75a, the OR gate 75b, and the OR gate 75c. Further, the output controller 81 includes a multiplexer 81a and a three-bit counter 81b.

Each time the rising edge of the duty upper limit signal is inputted from the upper limit signal generator 76, the three-bit counter 81b increments by one. The three-bit counter 81b counts in the sequence 0, 1, 2, 3, 4, 5 and then repeats the sequence. The multiplexer 81a has three input terminals: H-input terminal, L-input terminal, and an OR-input terminal. The H-input terminal is pulled up to a high level. The L-input terminal is pulled down to a low level. The OR-input terminal is connected to an output terminal of the OR gate 75c. The multiplexer 81a selects one input terminal in accordance with a count value of the three-bit counter 81b, for example, as follows. When the count value of the three-bit counter 81b is 0 or 1, the multiplexer 81a selects the H-input terminal. When the count value of the three-bit counter 81b is 2, the multiplexer 81a selects the L-input terminal. When the count value of the three-bit counter 81b is 3, 4, or 5, the multiplexer 81a selects the OR-input terminal.

Figure 7:
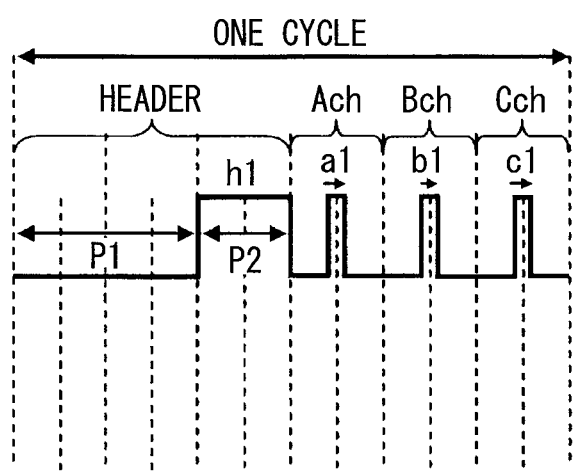
FIG. 7 illustrates a waveform of a PWM signal with a header.

Thus, the limited PWM signal outputted from the multiplexer 81a has a waveform shown in FIG. 7. As can be seen from FIG. 7, six periods of the reference wave provides one cycle (i.e., detection cycle) in which each of the anode voltages of the channels Ach, Bch, and Cch is detected once. The first three periods provide the header. The remaining three periods provide the limited PWM signal of the channels Ach, Bch, and Cch. In the header, the first two periods indicated by an arrow P1 are at a low level, and the remaining one period indicated by an arrow P2 is a 100% duty cycle pulse having a pulse width h1 equivalent to one period of the reference wave. Only in the header, the low level continues for more than one period of the reference wave. The high level period following the low level period continuing for more than one period of the reference wave is detected as the period of the reference wave.

The input controller 73A outputs a selection signal to the switcher 71 in accordance with a control signal outputted from the output controller 81 instead of the reference wave limit signal. For example, the output controller 81 outputs the count value of the three-bit counter 81b as the control signal. In this case, for example, when the count value of the three-bit counter 81b is 0, 1, or 2, the input controller 73A controls the switcher 71 so that the switcher 71 can maintain the selected channel, and when the count value of the three-bit counter 81b is 3, 4, or 5, the input controller 73A controls the switcher 71 so that the switcher 71 can sequentially select the channels Ach, Bch, and Cch.

When receiving the limited PWM signal with the header, the microcomputer 50 detects the header of the PWM signal by detecting that the first two periods of the limited PWM signal is at a low level. Then, the microcomputer 50 obtains the period of the reference wave by detecting the pulse width of the third period. In order for the microcomputer 50 to accurately detect the duty cycle of each of the channels Ach, Bch, and Cch, the microcomputer 50 needs to accurately detect the period of the reference wave. To this end, a 100% duty cycle pulse having the pulse width h1 is added to the limited PWM signal, and the period of the reference wave is detected with respect to the 100% duty cycle pulse. Then, when receiving pulse widths a1, b1, and c1 of the limited PWM signals of the respective channels Ach, Bch, and Cch following the header, the microcomputer 50 calculates the duty cycles of the respective channels Ach, Bch, and Cch as follows. The duty cycle of the channel Ach is calculated by divining the pulse width a1 by the pulse width h1. The duty cycle of the channel Bch is calculated by divining the pulse width b1 by the pulse width h. The duty cycle of the channel Cch is calculated by divining the pulse width c1 by the pulse width h.

As described above, according to the third embodiment, the output controller 81 adds a 100% duty cycle pulse having the pulse width h1 equivalent to one period of the reference wave to the limited PWM signal. In such an approach, the microcomputer 50 can accurately detect the duty cycle of each of the channels Ach, Bch, and Cch with respect to the added pulse. Further, the boundary between the header and the pulse following the header can be accurately detected by setting an upper limit on the duty cycle of the PWM signal.

Fourth Embodiment

Figure 8:
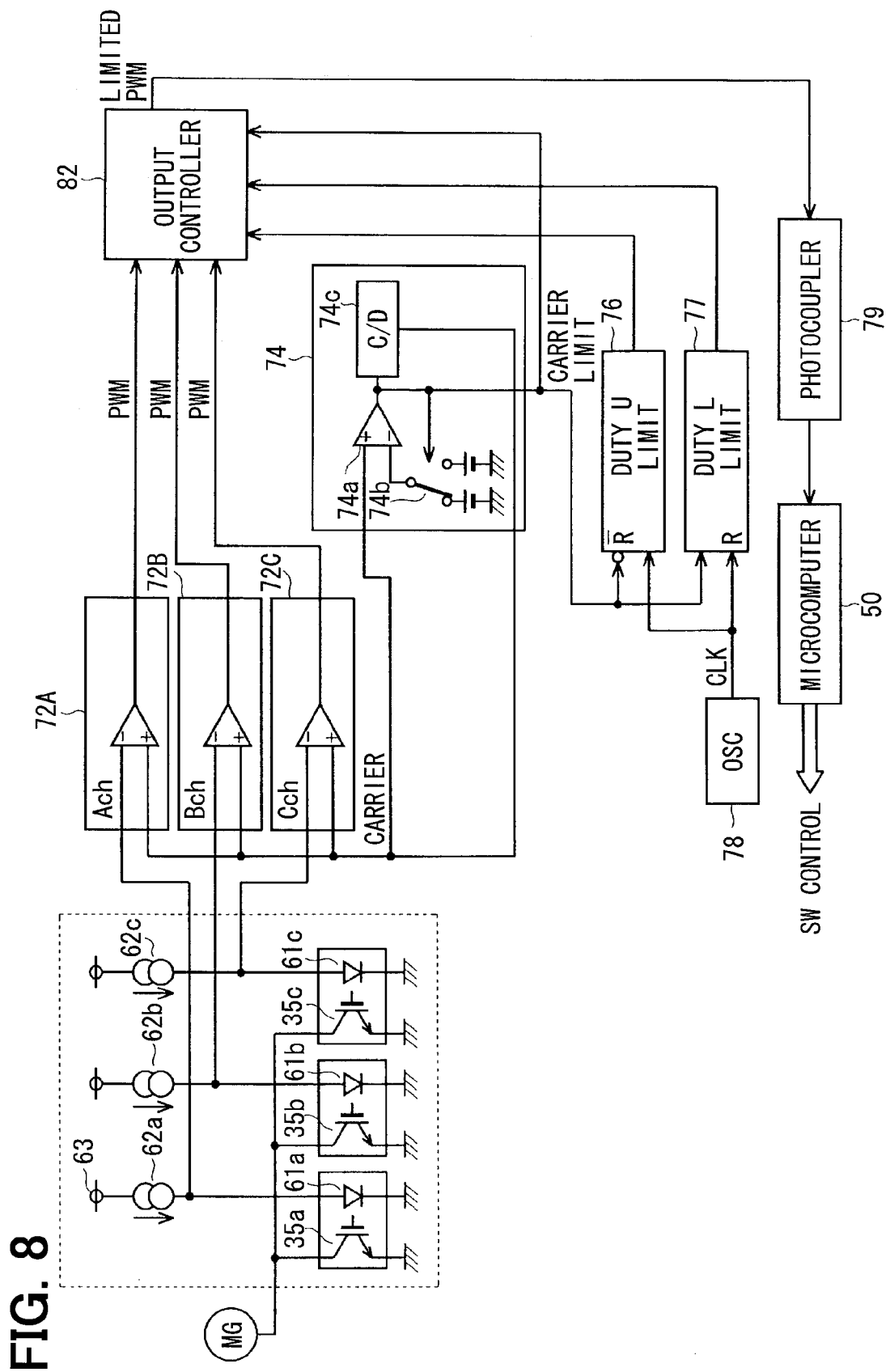
FIG. 8 illustrates a functional block diagram of a PWM duty cycle converter according to a fourth embodiment of the present disclosure.

A fourth embodiment of the present disclosure is described below with reference to FIG. 8. A difference between the first embodiment and the fourth embodiment is as follows. According to the fourth embodiment, the switcher 71 and the input controller 73 are removed. Instead, the duty converter 72 is provided to each of the channels Ach, Bch, and Cch. Specifically, an Ach duty converter 72A is provided to the channel Ach, a Bch duty converter 72B is provided to the channel Bch, and a Cch duty converter 72C is provided to the channel Cch. The anode voltages of the diodes 61a, 61b, and 61c are inputted to the Ach duty converter 72A, the Bch duty converter 72B, and the Cch duty converter 72C, respectively. The reference wave outputted from the reference wave generator 74 is inputted to each of the Ach duty converter 72A, the Bch duty converter 72B, and the Cch duty converter 72C.

The reference wave limit signal is inputted to an output controller 82 instead of the output controller 75. The output controller 75 has a function of serving as the switcher 71 and the input controller 73. The output controller 82 counts the edge of the reference wave limit signal and sequentially outputs duty pulses inputted from the Ach duty converter 72A, the Bch duty converter 72B, and the Cch duty converter 72C in accordance with the count value. Thus, like the first embodiment, the output controller 75 generates one PWM signal by serially arranging the duty commands of the channels Ach, Bch, and Cch.

Fifth Embodiment

Figure 9:
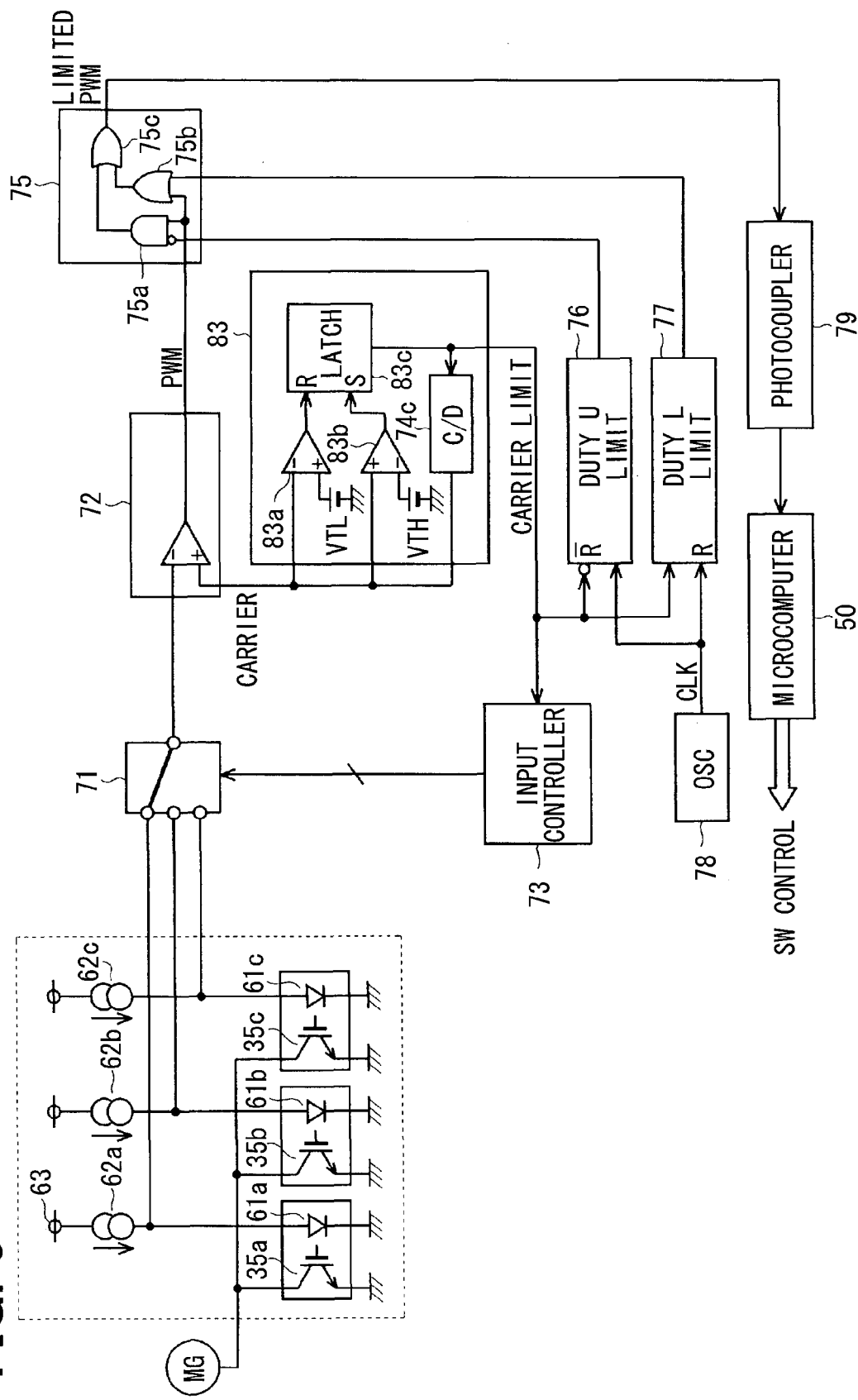
FIG. 9 illustrates a functional block diagram of a PWM duty cycle converter according to a fifth embodiment of the present disclosure.
Figure 10:
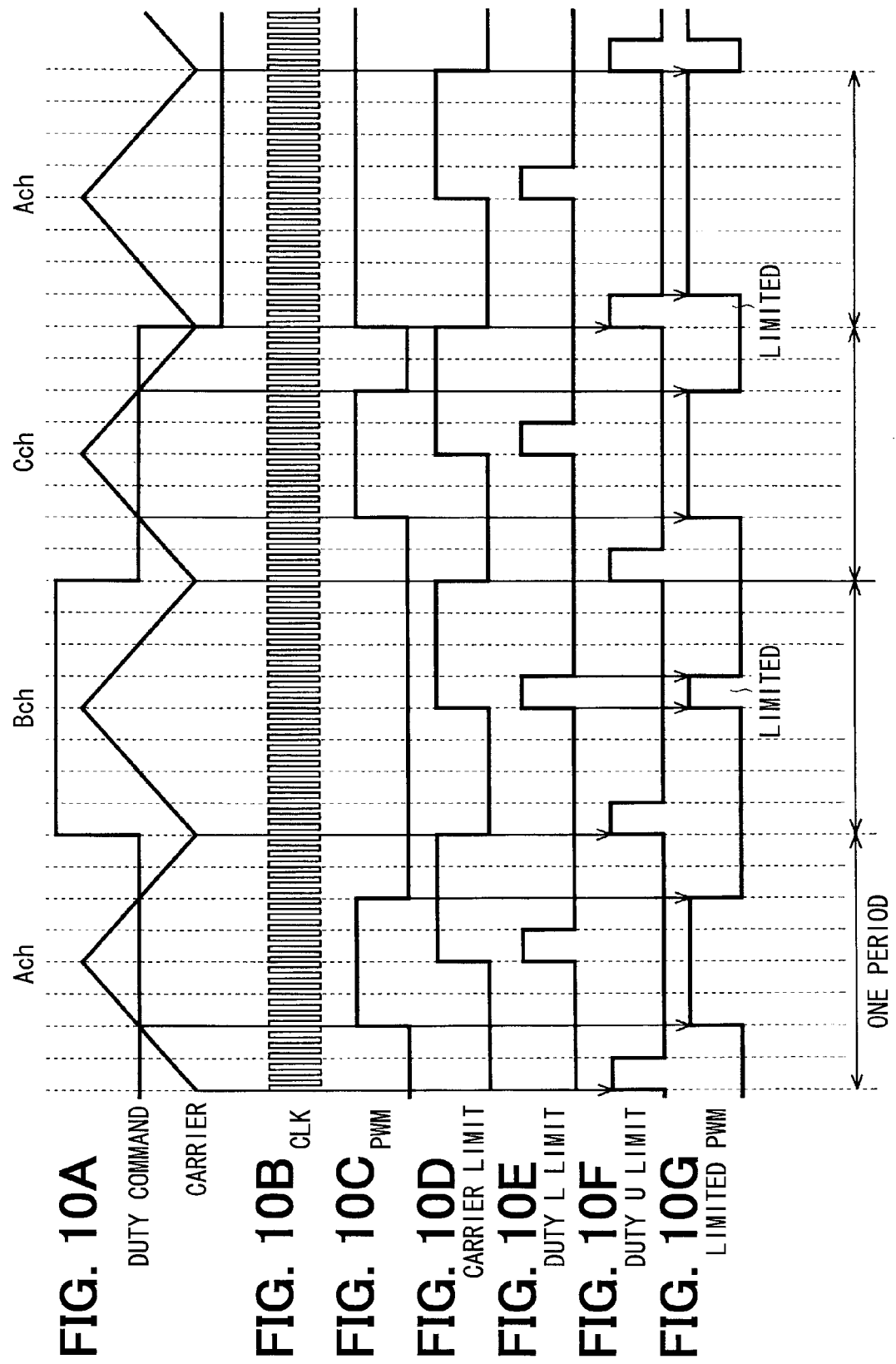
FIGS. 10A-10G illustrate a timing chart of the PWM duty cycle converter according to the fifth embodiment.

A fifth embodiment of the present disclosure is described below with reference to FIGS. 9 and 10. A difference between the first embodiment and the fifth embodiment is as follows. According to the fifth embodiment, a reference wave generator 83 instead of the reference wave generator 74 includes two comparators 83a and 83b and a latch circuit 83c. For example, the latch circuit 83c can be a RS flip flop. Output signals of the comparators 83a and 83b are inputted to the latch circuit 83c so that the latch circuit 83c can output the reference wave limit signal. The reference wave is inputted to each of an inverting input terminal of the comparator 83a and a non-inverting input terminal of the comparator 83b. The low reference voltage VTL, which is almost equal to the minimum value of the amplitude of the reference wave, is applied to an non-inverting input terminal of the comparator 83a. The high reference voltage VTH, which is almost equal to the maximum value of the amplitude of the reference wave is applied to an inverting input terminal of the comparator 83b.

The comparator 83b outputs a set signal to the latch circuit 83c, when the amplitude of the reference wave exceeds the high reference voltage VTH. The comparator 83a outputs a reset signal to the latch circuit 83c, when the amplitude of the reference wave decreases below the low reference voltage VTL. Thus, as can be seen from FIG. 2D and FIG. 10D, the reference wave limit signal outputted from the reference wave generator 83 is opposite in phase with the reference wave limit signal outputted from the reference wave generator 74 of the first embodiment. Even in such a structure, the same advantage as the first embodiment can be achieved.

Sixth Embodiment

Figure 11:
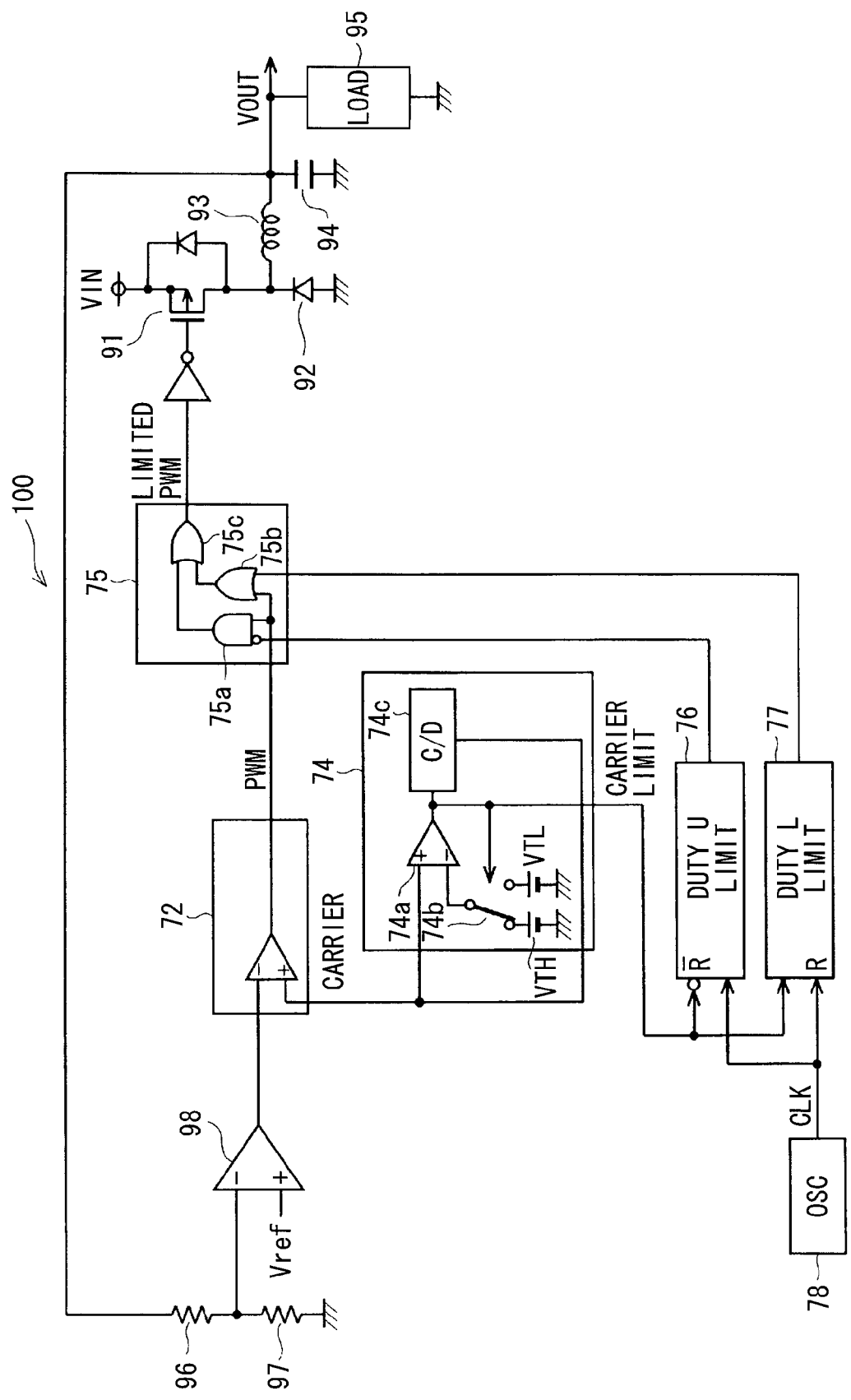
FIG. 11 illustrates a functional block diagram of a PWM duty cycle converter according to a sixth embodiment of the present disclosure.
Figures 12A, 12B, 12C:
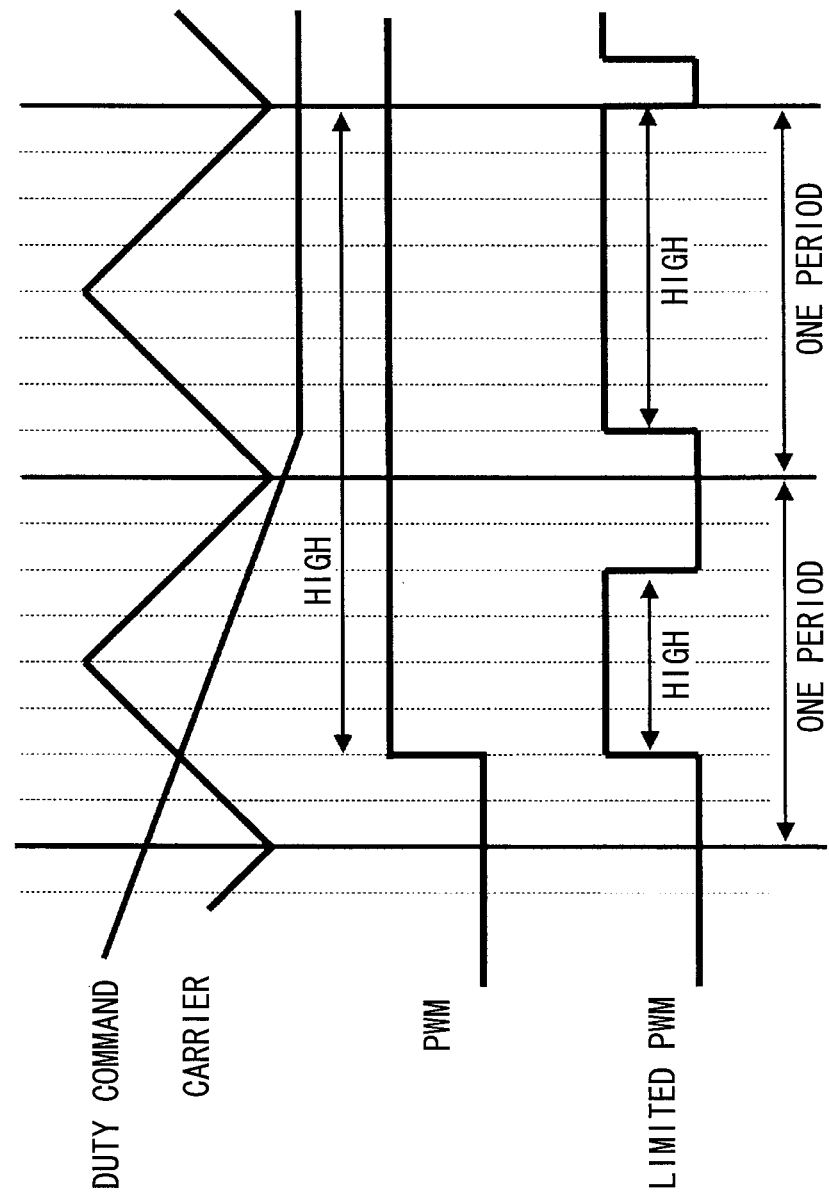
FIGS. 12A-12C illustrate a timing chart of a prior art.

A sixth embodiment of the present disclosure is described below with reference to FIG. 11. In the sixth embodiment, the structure of the first embodiment is applied to a switching power supply circuit 100. A series circuit of a P-channel MOSFET 91 (as a switching element, an output transistor) and a diode 92 is connected between a power source VIN and a ground potential. A connection point between the MOSFET 91 and the diode 92 (i.e., between a drain of the MOSFET 91 and an anode of the diode 92) is connected through a coil 93 to a first end of each of a capacitor 94 and a load 95. A second end of each of the capacitor 94 and the load 95 is connected to the ground potential. A connection point between the coil 93 and the load 95 forms a power supply output terminal for outputting an output voltage VOUT.

The power supply output terminal is connected to the ground potential through a series circuit of resistors 96 and 97. A connection point between the resistors 96 and 97 is connected to an inverting input terminal of a differential amplifier 98 (as a signal source). A reference voltage Vref is applied to a non-inverting input terminal of the differential amplifier 98. An output terminal of the differential amplifier 98 is connected to an input terminal of the duty converter 72. The limited PWM signal outputted from the output controller 75 is inputted through a NOT gate 99 (i.e., driver) to a gate of the P-channel MOSFET 91. In this way, the switching power supply circuit 100 is constructed. It is noted that a signal outputted from the differential amplifier 98 is the duty command.

In the switching power supply circuit 100, the MOSFET 91 is turned ON and OFF by the limited PWM signal having a duty cycle on which the upper and lower limits are set.

In the switching power supply circuit 100, the PWM signal is generated based on a duty command from one signal source (i.e., differential amplifier 98). Even in such a case, it is necessary to set an upper limit and/or a lower limit on the duty cycle of the PWM signal for the following reasons. In the switching power supply circuit 100, due to variations in the power source VIN and the load 95, there is a possibility that the output voltage of the differential amplifier 98 exceeds the maximum value of the amplitude of the reference wave or falls below the minimum value of the amplitude of the reference wave. In such a case, a missing pulse occurs in the PWM signal so that a missing duration can occur in the switching operation of the MOSFET 91. That is, the MOSFET 91 is not controlled during the missing duration.

If such a missing pulse occurs, the switching frequency of the MOSFET 91 varies. As a result, noise cannot be reduced by a filter having a time constant which is preset according to the switching frequency. For this reason, it is necessary to set the upper limit and/or the lower limit on the duty cycle of the PWM signal. The switching of the MOSFET 91 can be stably performed by setting the upper limit and/or the lower limit on the duty cycle of the PWM signal However, when the duty cycle of the PWM signal is limited, the actual switching operation of the MOSFET 91 does not correspond to the duty command, which is the output voltage of the differential amplifier 98. As a result, accuracy of the output voltage VOUT may be degraded. To prevent such a disadvantage, it is necessary that the upper limit and the lower limit of the duty cycle of the PWM signal are accurately set close to 0% and 100%, respectively. Therefore, the present disclosure can be effectively applied to a power supply circuit like the switching power supply circuit 100.

As described above, according to the sixth embodiment, the upper limit and/or the lower limit are set on the duty cycle of the PWM signal for controlling the switching power supply circuit 100. In such an approach, the switching control is stably performed so that the accuracy of the output voltage VOUT of the switching power supply circuit 100 can be improved.

(Modifications)

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

For example, only one of the duty upper limit signal and the duty lower limit signal can be used to limit the duty cycle of the PWM signal.

In the second embodiment, the microcomputer 50 can write first and second threshold values in the duty limit register 80. In this case, the first threshold value is used to change the time width of the duty upper limit signal, and the second threshold value is used to change the time width of the duty lower limit signal. Alternatively, two duty limit registers 80 can be added. In this case, the microcomputer 50 writes the first threshold value in one of the duty limit registers 80 and the second threshold value in the other of the duty limit registers 80.

In the third embodiment, the input controller 73A can control the switcher 71 in accordance with the reference wave limit signal like in the first embodiment.

In the third embodiment, the reference wave can be directly inputted to the microcomputer 50 so that the microcomputer 50 can detect the period of the reference wave. In this case, there is no need to add the header.

The structure described in the second embodiment can be applied to any one of the third, fourth, and fifth embodiments.

The structure for adding the header in the third embodiment can be employed in the fourth and fifth embodiments. A format of the header is not limited to that descried in the third embodiment, as long as the header contains data indicative of the period of the reference wave.

The reference wave limit signal can be produced by a circuit independent of the reference wave generator, as long as the reference wave limit signal can be in synchronization with the reference wave.

The reference wave limit signal can comprise a reference wave upper limit signal outputted synchronously with the maximum value of the amplitude of the reference wave and a reference wave lower limit signal outputted synchronously with the minimum value of the amplitude of the reference wave. In this case, the upper limit signal generator, the lower limit signal generator, and the charge-discharge section of the reference generator are configured to correspond to the reference wave upper limit signal and the reference wave lower limit signal.

The switching device described in the embodiments is not limited to an IGBT. For example, the switching device can be a bipolar transistor or a MOSFET.

The signal source for outputting an analog input signal as a duty command is not limited to a temperature sensor for detecting the temperature of the switching device.

In the first embodiment, each of the switching devices 34-39 of the inverter 30 is constructed with multiple pairs of a switching element and a diode. Alternatively, each of the switching devices 34-39 of the inverter 30 can be constructed with one pair of a switching element and a diode. In this case, the switcher 71 and the input controller 73 can be removed.

The present disclosure can be applied to a device or apparatus other than a power converter such as the inverter 30 and a power supply circuit such as the switching power supply circuit 100, as long as the device or apparatus processes a duty command from at least one signal source.

What is claimed is:

1. A pulse width modulation (PWM) duty cycle converter comprising:
   a PWM signal generator configured to generate a first PWM signal by comparing a triangular carrier wave with at least one duty command from at least one signal source;
   a timing signal generator configured to generate a timing signal synchronously with at least one of a maximum value and a minimum value of an amplitude of the carrier wave;
   a limit signal generator configured to generate a limit signal in response to the timing signal, the limit signal setting both an upper limit and a lower limit on a duty cycle of the first PWM signal, and
   a duty cycle limiter configured to combine the first PWM signal and the limit signal to output a second PWM signal having a limited duty cycle, wherein
   the limit signal comprises an upper limit signal and a lower limit signal,
   the upper limit signal sets the upper limit on the duty cycle of the first PWM signal, and
   the lower limit signal sets the lower limit on the duty cycle of the first PWM signal.

2. The PWM duty cycle converter according to claim 1, wherein
   the PWM signal generator serially arranges a plurality of duty commands from a plurality of signal sources and generates the first PWM signal by comparing the carrier wave with the serially-arranged plurality of duty commands.

3. The PWM duty cycle converter according to claim 2, wherein
   the duty cycle limiter adds a 100% duty cycle pulse to the second PWM signal, and
   a width of the 100% duty cycle pulse is equivalent to a period of the carrier wave.

4. The PWM duty cycle converter according to claim 1, wherein
   each of the lower limit signal and the upper limit signal is a high level pulse,
   the duty limiter includes a first logic gate, a second logic gate, and a third logic gate,
   the first logic gate performs a logical OR operation between the first PWM signal and the lower limit signal,
   the second logic gate performs a logical AND operation between the first PWM signal and an inversion signal of the upper limit signal, and
   the third logic gate performs a logical OR operation between an output of the first logic gate and an output of the second logic gate.

5. The PWM duty cycle converter according to claim 1, wherein
   the timing signal generator outputs the timing signal synchronously with the at least one of the maximum value and the minimum value of the amplitude of the carrier wave, and
   the timing signal has the same period as the carrier wave and is a square wave having a duty cycle of 50%.

6. The PWM duty cycle converter according to claim 5, wherein
   the timing signal generator includes a carrier wave generator, and
   the carrier wave generator generates the carrier wave by alternately charging and discharging a capacitor by a constant current in accordance with the timing signal.

7. A pulse width modulation (PWM) duty cycle converter comprising:
   a PWM signal generator configured to generate a first PWM signal by comparing a triangular carrier wave with at least one duty command from at least one signal source;
   a timing signal generator configured to generate a timing signal synchronously with at least one of a maximum value and a minimum value of an amplitude of the carrier wave;
   a limit signal generator configured to generate a limit signal in response to the timing signal, the limit signal setting at least one of an upper limit and a lower limit on a duty cycle of the first PWM signal, and
   a duty cycle limiter configured to combine the first PWM signal and the limit signal to output a second PWM signal having a limited duty cycle, wherein
   the limit signal generator includes an oscillator circuit and a counter circuit,
   the oscillator circuit outputs a clock signal having a frequency higher than a frequency of the carrier wave,
   the counter circuit starts a counting operation based on the clock signal and changes the limit signal to an active level in response to the timing signal, and
   the counter circuit changes the limit signal to an inactive level after the counting operation is continued for a time period corresponding to the limit signal.

8. The PWM duty cycle converter according to claim 7, wherein
   the limit signal generator includes a register, and
   the register stores a threshold value for defining the time period corresponding to the limit signal.

* * * * *